United States Patent [19]

Christian et al.

[11] Patent Number: 4,468,857
[45] Date of Patent: Sep. 4, 1984

[54] METHOD OF MANUFACTURING AN INTEGRATED CIRCUIT DEVICE

[75] Inventors: Raymond R. Christian, Oaklawn; Joseph C. Zuercher, Wilmette, both of Ill.

[73] Assignee: Teletype Corporation, Skokie, Ill.

[21] Appl. No.: 508,317

[22] Filed: Jun. 27, 1983

[51] Int. Cl.³ .................... H01L 21/78; H01L 21/95
[52] U.S. Cl. .................................. 29/577 C; 357/80; 357/54; 29/583; 156/630; 156/632
[58] Field of Search ................ 29/571, 577 C, 583, 29/588; 357/51, 54, 80; 219/216 PH, 543; 338/308, 309; 346/76 PH, 139 C; 156/631, 632, 662

[56] References Cited

U.S. PATENT DOCUMENTS

| | | | |
|---|---|---|---|
| 3,852,563 | 12/1974 | Bohorquez et al. | 346/76 PH |
| 3,889,358 | 6/1975 | Barhenke | 357/51 |
| 3,902,936 | 9/1975 | Price | 156/3 |
| 4,110,598 | 8/1978 | Small | 346/76 PH |
| 4,134,125 | 1/1979 | Adams et al. | 357/54 |
| 4,266,334 | 5/1981 | Edwards et al. | 29/583 |

Primary Examiner—Aaron Weisstuch
Assistant Examiner—Hunter L. Auyang
Attorney, Agent, or Firm—W. K. Serp

[57] ABSTRACT

A method for manufacturing an integrated circuit device illustrates the preparation of the first surface of a circuit wafer including the placement of fine alignment indicia 34a outside the active chip area. A support wafer 50 is secured to the first surface of the circuit wafer 10 by an adhesive layer 58. The circuit wafer 10 is thinned. Openings 66 are photoshaped in the circuit wafer 10 using wafer flats 51 for alignment. The openings expose alignment indicia 34a which are relief images in the adhesive of the alignment pattern 34. The exposed surface of the circuit wafer 10 is photoshaped, using the indicia 34a for alignment, to define wafer segments 68 positioned over resistor doped regions 22.

3 Claims, 4 Drawing Figures

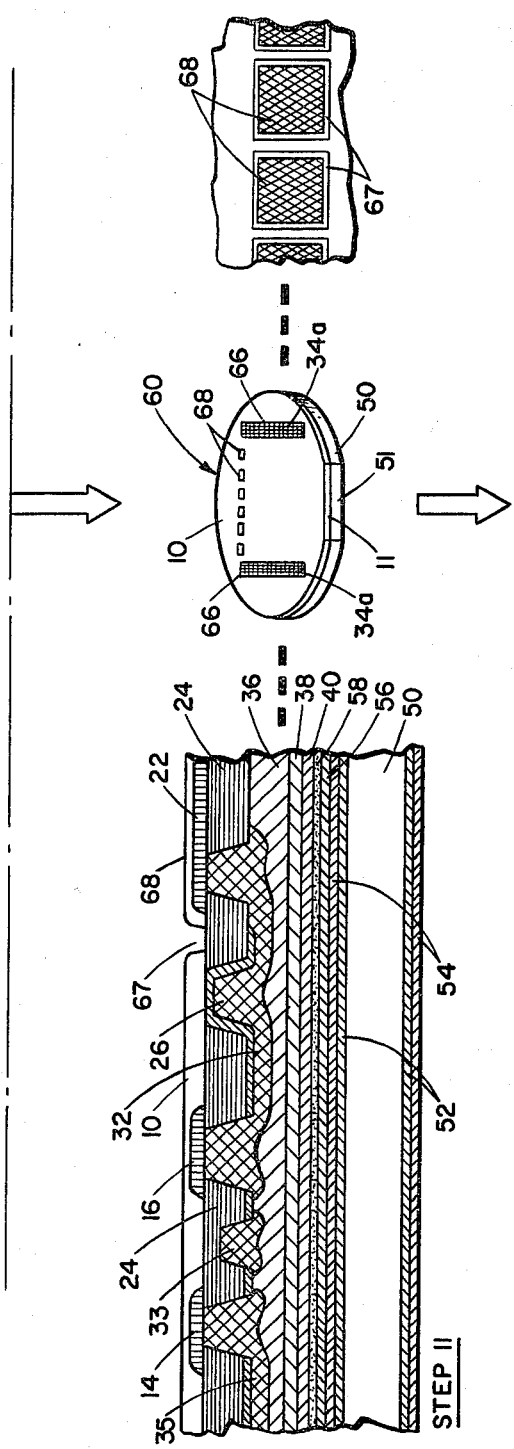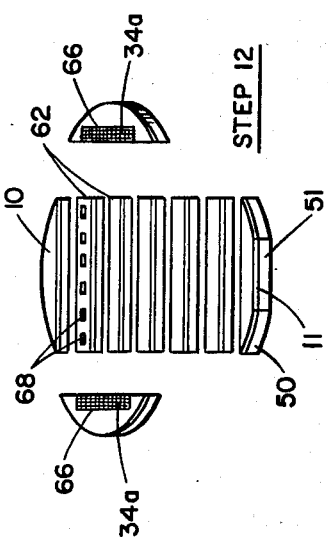

METHOD OF MANUFACTURING AN INTEGRATED CIRCUIT DEVICE

TECHNICAL FIELD

This invention relates to a method for manufacturing an integrated circuit device.

BACKGROUND ART

In the prior art, there are various fixtures and tools for the alignment of process steps on the two major faces of a silicon wafer during the manufacture of integrated circuit devices. Such arrangements generally rely on indicia on the outer surface of the wafer being processed to provide alignment of process steps on the two wafer faces. Accordingly, these prior arrangements are difficult to implement and the results are uncertain.

DISCLOSURE OF THE INVENTION

A method is described for manufacturing an integrated circuit device which includes the step of processing a silicon wafer to form an integrated circuit and at least one alignment pattern on a first surface of the wafer. A support wafer is prepared for subsequent processing and is positioned on the first surface of the circuit wafer adjacent a first surface of the support wafer. A layer of adhesive is formed on the adjacent surfaces of the circuit and support wafers causing the two surfaces to adhere forming a wafer sandwich. The circuit wafer is photoshaped to create an opening to expose alignment indicia corresponding to the alignment pattern. The circuit wafer is processed using the exposed alignment indicia and the wafer sandwich is thereafter sliced into integrated circuit chips.

Preferably, prior to processing the circuit wafer using the alignment indicia, a coarse index is applied to the circuit wafer. The photoshaping operation which creates the openings exposing the alignment indicia is aligned with the coarse index. Additionally, access may be provided to selected portions of the integrated circuit and electrical connections made to these selected portions.

THE DRAWING

FIGS. 1, 2 and 3, as arranged in FIG. 4, illustrate sequential process steps for manufacturing an integrated circuit device in accordance with this invention.

DETAILED DESCRIPTION

Figure 1:
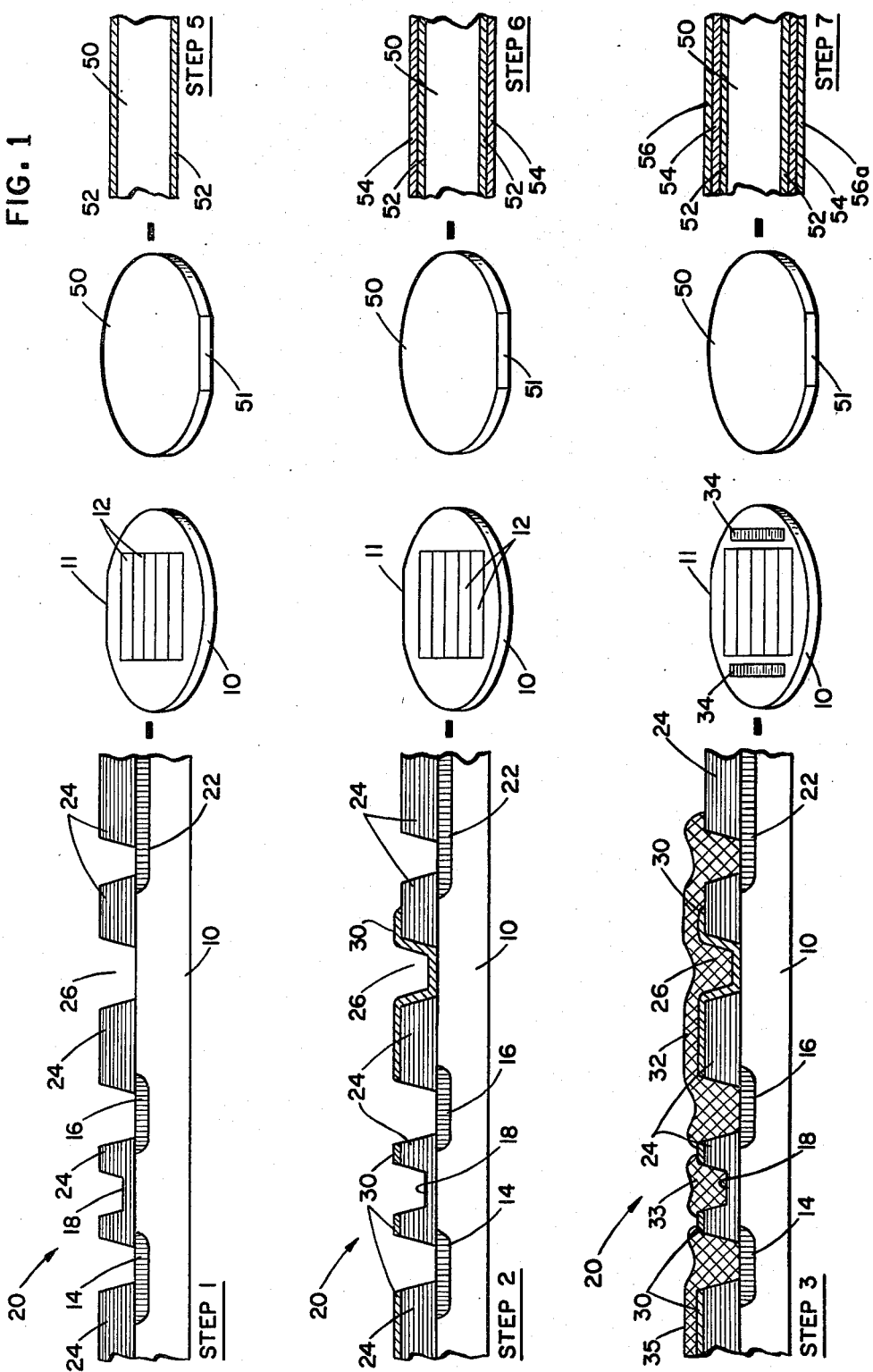
Figure 2:
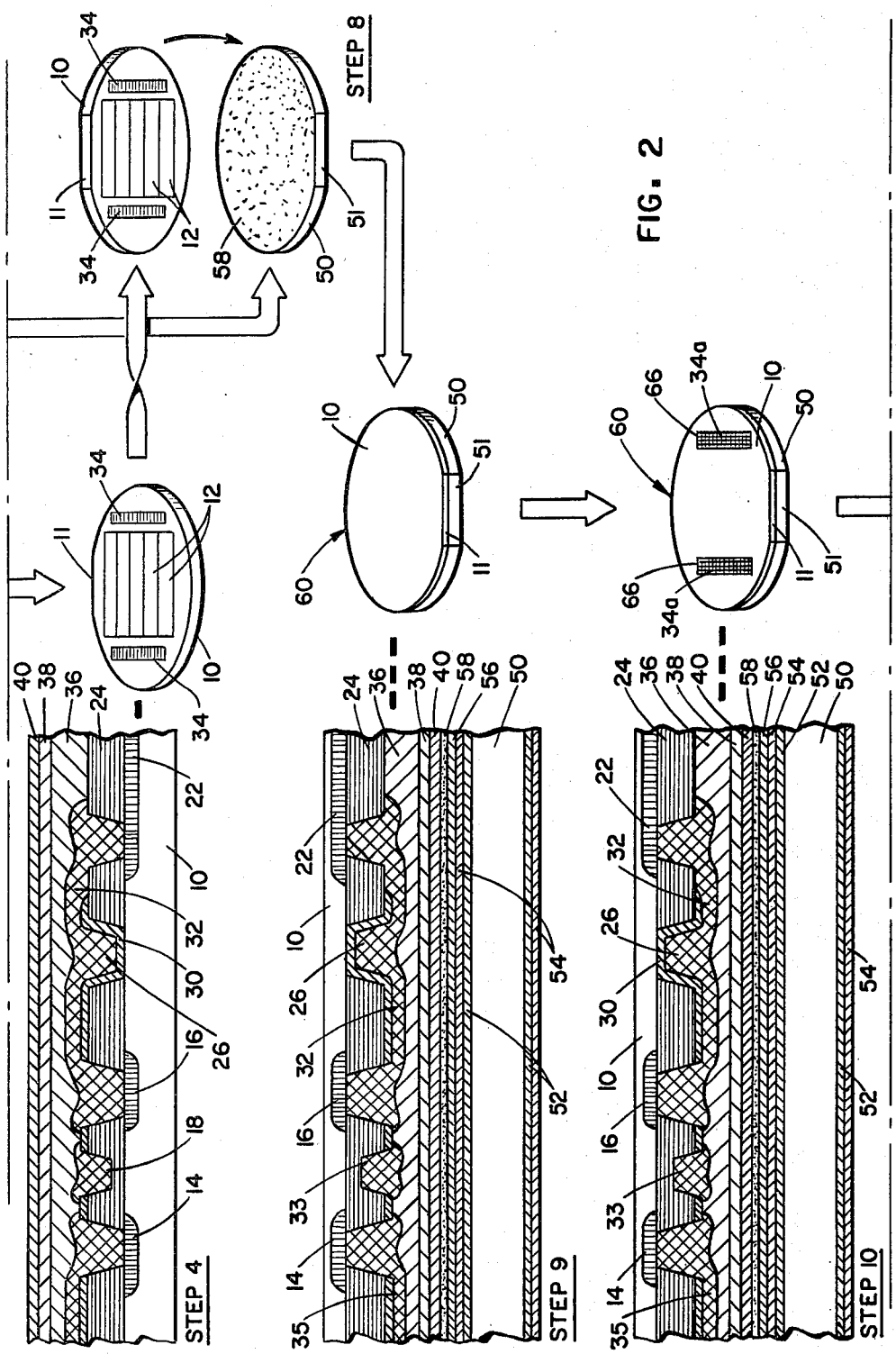

As shown in Step 1 of FIG. 1, an N-type silicon wafer 10 having a major flat 11 has formed therein several individual inytegrated circuits 12, by way of example MOS structures. A portion of one of the integrated circuits 12, which is illustrated in the partial sectional view in Step 1, includes sourcedrain doped regions 14 and 16 and a gate area 18, which in combination forms a transistor 20. Obviously, the drawing is not to scale and is exaggerated vertically to more clearly illustrate certain features of the process. Another doped region 22 in the surface of the wafer 10 forms a resistor. A field oxide layer 24 is grown on the surface of the wafer 10 and a recess or moat 26 is photoshaped therein. The moat 26 surrounds and isolates the transistor 20, forming the active circuit, from the passive resistor doped region 22. In Step 2, the surface of the wafer 10 is covered with a layer of silicon nitride 30 which is thereafter photoshaped and allowed to remain over the moat 26. The moat 26, covered with the silicon nitride 30, provides a barrier or edge seal which excludes environmental contaminants, such as sodium, from the active transistor 20.

In Step 3, conductors 32, 33, and 35 of metal, e.g., aluminum are deposited and photoshaped to provide connections to desired locations on the wafer 10. The conductor 32 crosses the moat 26 and connects the transistor 20 to the resistor doped region 22. Alignment patterns 34 for guiding subsequent wafer processing are formed outside of the usable chip areas at two selected locations upon the wafer 10. In Step 4, the wafer 10 is successively covered with a silicon dioxide layer 36, a silicon nitride layer 38, and by a second silicon dioxide layer 40. This triple passivation layer provides a barrier to the migration of environmental contaminants to the active circuitry. The outermost silicon dioxide layer 40 also provides a compatible interface medium to a layer of adhesive which is applied in a subsequent processing step.

In Step 5, a support wafer 50 having a major flat 51 is prepared by exposing it to an oxide environment at an elevated temperature causing the growth of silicon dioxide layers 52 upon the exposed surfaces of the wafer 50. In Step 6, silicon nitride layers 54 are deposited upon the surfaces of the dioxide layer 52. In Step 7, silicon dioxide layers 56,56a are formed by oxidizing the nitride layer 54. The silicon dioxide layer 56 provides a compatible surface for an adhesive layer 58 which is applied in Step 8. The adhesive layer 58 may be coated on the silicon dioxide layer 56 of the support wafer 50 by any one of several methods known in the art. A suitable method is to spin the wafer 50 after adhesive has been placed thereon, and thereafter outgassing the wafer in an evacuated chamber (not shown) to remove gas bubbles from the adhesive.

In Step 8, the circuit wafer 10 and the support wafer 50 are brought together in a vacuum to avoid air entrapment. The adhesive 58 is cured at a high temperature resulting in a unitary wafer sandwich 60.

In optional Step 9, the sandwich 60 is placed in a potassium hydroxide etchant bath (not shown) which thins the circuit wafer 10 uniformly to retain parallelism of the faces of that wafer and removes the silicon dioxide layer 56a from the exposed surface of the support wafer 50. The silicon nitride outer layer 54 of the wafer 5 resists the etchant bath and thus remains unaltered.

In Step 10, openings 66 are photoshaped in the circuit wafer 10 to expose the alignment indicia 34a which are the relief images in the adhesive 58 of the alignment pattern 34. The wafer flats 11 and 51 are used as coarse alignment indicators during the photoshaping of the openings 66. After the alignment indicia 34a are exposed, further processing of the wafer sandwich 60, which requires accurate reference to the circuit elements which are buried in the wafer sandwich 60, may proceed. Examples of such processing are set forth in the following description.

In Step 11, a trough 67 is etched through the circuit wafer 10 defining square shaped segments 68 as illustrated in the enlarged fragmentary top view in Step 11. In this way, each segment 68 is accurately positioned over its associated resistor doped region 22. During etching, the walls of the trough 67 form an angle of 54.76 degrees with the plane of the wafer 10 surface. This particular angle is characteristic of commerically available <100> crystalline orientation silicon. The reduction in the thickness of the circuit wafer in Step 9 allows closer spacing of the segments 68 than would otherwise be possible.

In Step 12, the wafer sandwich 60 is sliced into discrete integrated circuit chips 62. Additionally, the wafer 10 may be etched to produce openings to selected portions of the integrated circuit. Thereafter, electrical connections are made to these selected portions.

While this invention has been particularly shown and described in connection with an illustrated embodiment, it will be appreciated that various changes may be made without departing from the spirit and scope of the invention as set forth in the following claims.

What is claimed is:

1. A method for manufacturing an integrated circuit device comprising the steps of:
   (A) processing a silicon circuit wafer (10) to form an integrated circuit (12) and at least one alignment pattern (34) on a first surface of the circuit wafer (10);
   (B) preparing the surfaces of a support wafer (50) for subsequent processing;
   (C) positioning the first surface of the circuit wafer (10) opposing a first surface of the support wafer (50);
   (D) forming a layer of adhesive (58) on the opposing first surfaces of said circuit (10) and said support (50) wafers so as to cause the two wafers to adhere together forming a wafer sandwich (60);
   (E) photoshaping the circuit wafer to create an opening (66) therein to expose alignment indicia (34*a*) corresponding to the alignment pattern (34);
   (F) processing the surface of the circuit wafer (10) using the alignment indicia (34*a*) exposed in Step E; and
   (G) slicing the wafer sandwich (60) into integrated circuit chips (62).

2. The method of claim 1 wherein prior to Step F a coarse index is applied to the circuit wafer and the photoshaping at Step E is aligned with the coarse index.

3. The method of claim 1 wherein in Step F the processing provides access to selected portions of said integrated circuit and the method further includes: providing electrical connections to said selected portions.

* * * * *